US008890540B2

(12) United States Patent
Li et al.

(10) Patent No.: US 8,890,540 B2
(45) Date of Patent: Nov. 18, 2014

(54) PARTIAL DISCHARGE EXPERIMENT POWER SUPPLY SYSTEM FOR EXTRA-HIGH VOLTAGE TRANSFORMER AND METHOD THEREOF

(75) Inventors: Guangfan Li, Beijing (CN); Jie Yang, Beijing (CN); Jinzhong Li, Beijing (CN); Xiaocen Hu, Beijing (CN); Shuqi Zhang, Beijing (CN); Yuewen Qi, Beijing (CN); Xiaoning Wang, Beijing (CN); Ninghua Wang, Beijing (CN)

(73) Assignee: China Electric Power Research Institute, Beijing (CN)

( * ) Notice: Subject to any disclaimer, the term of this patent is extended or adjusted under 35 U.S.C. 154(b) by 291 days.

(21) Appl. No.: 13/513,491

(22) PCT Filed: Nov. 12, 2010

(86) PCT No.: PCT/CN2010/001815
§ 371 (c)(1),
(2), (4) Date: Aug. 17, 2012

(87) PCT Pub. No.: WO2011/066714
PCT Pub. Date: Jun. 9, 2011

(65) Prior Publication Data
US 2012/0306511 A1    Dec. 6, 2012

(30) Foreign Application Priority Data
Dec. 4, 2009    (CN) .......................... 2009 1 0241330

(51) Int. Cl.
*H01H 31/02*    (2006.01)
*G01R 31/12*    (2006.01)
*G01R 31/02*    (2006.01)

(52) U.S. Cl.
CPC .......... *G01R 31/1227* (2013.01); *G01R 31/027* (2013.01)
USPC ......................................................... 324/555

(58) Field of Classification Search
USPC ......... 324/555, 547–549, 500, 160, 177, 139, 324/143, 765.01, 76.11
See application file for complete search history.

(56) References Cited

U.S. PATENT DOCUMENTS

| | | | | |
|---|---|---|---|---|
| 4,584,165 A | * | 4/1986 | Wilson et al. | 376/216 |
| 2008/0298784 A1 | * | 12/2008 | Kastner | 388/811 |

FOREIGN PATENT DOCUMENTS

| | | |
|---|---|---|
| CN | 101201363 A | 6/2008 |
| CN | 101718804 A | 6/2010 |
| CN | 201569675 U | 9/2010 |
| JP | 11-142467 A | 5/1999 |

OTHER PUBLICATIONS

International Search Report and Written Opinion mailed Feb. 17, 2011, issued in corresponding International Application No. PCT/CN2010/001815, filed Nov. 12, 2010, 11 pages.
International Preliminary Report on Patentability and Written Opinion mailed Jun. 5, 2012, issued in corresponding International Application No. PCT/CN2010/001815, filed Nov. 12, 2010, 7 pages.

* cited by examiner

*Primary Examiner* — Patrick Assouad
*Assistant Examiner* — Trung Nguyen
(74) *Attorney, Agent, or Firm* — Christensen O'Connor Johnson Kindness PLLC

(57) ABSTRACT

A partial discharge test power supply system for an extra high voltage transformer comprises: an electric motor (1); an intermediate frequency generator (2) driven by the electric motor and outputting an intermediate frequency voltage; a middle transformer (9) receiving the intermediate frequency voltage and outputting a test voltage to be applied to a test sample (11) by a generator outlet (5); a low-voltage compensating reactor (8) connected between the intermediate frequency generator and the middle transformer; a high-voltage compensating reactor (10) connected between the middle transformer and the sample; wherein the electric motor and the intermediate frequency generator are arranged in a metal housing (100). The system also includes the following filters: a filter (a) arranged in the excitation circuit of the intermediate frequency generator, a filter (b) arranged between the high-voltage compensating reactor and the sample and a filter (c) arranged between the generator outlet and the low-voltage compensating reactor. The system provides a simple and reliable power source system with little background interference for the extra high voltage partial discharge tests.

12 Claims, 2 Drawing Sheets

PARTIAL DISCHARGE EXPERIMENT POWER SUPPLY SYSTEM FOR EXTRA-HIGH VOLTAGE TRANSFORMER AND METHOD THEREOF

TECHNICAL FIELD

The present disclosure relates to high voltage and insulation technologies, more specifically, to a power supply system and method for partial discharge test of extra high voltage transformers (EHVT).

BACKGROUND

During the long operation period of a transformer, partial discharge may occur at some weak locations of its internal insulation under high intensity fields, leading to degradation of the insulation performance. With the long-term effect of severe partial discharge, it may even cause breakdown, and thus damage transformer. With respect to a transformer, especially an extra high voltage transformer, in order to check its insulation, a test of ACLD (AC voltage long-duration) with partial discharge must be carried out to examine insulation performance. In the on-site test, it is necessary to use a simple and reliable power supply system for the test to apply voltage to the transformer samples according to test requirements, while effectively suppressing or avoiding interference of the test power supply system itself, so that the interference of the test power supply system itself may meet the requirement of the partial discharge test. Because extra high voltage transformer substations usually have complex electromagnetic environments and a lot of outside interference sources exist, the test power supply systems in the prior art themselves have higher background interference level, unable to meet test requirements of extra high voltage transformers. Besides, the test power supply systems in the prior art have less capacities, usually, only adequate to tests for the transformers at level of 500 kV or less. However, when the capacity increases, the startup current of the motor may exceed a current threshold allowed by transformer substations, which therefore is unsuitable for extra high voltage transformers (e.g., 1000 kV and above transformers).

SUMMARY

The object of this disclosure is to overcome the problem identified above in the prior art, through providing a partial discharge test power supply system with small background interference, which is simple and reliable, capable of meeting partial discharge test requirements of extra high voltage transformers.

Another object of this disclosure is to provide a method of carrying out partial discharge test on an extra high voltage transformer.

In order to realize the above object, according to a first aspect of this disclosure, a partial discharge test power supply system for extra high voltage transformers is provided, comprising: an electric motor, an intermediate frequency generator driven by the electric motor and outputting an intermediate frequency voltage; a middle transformer receiving the intermediate frequency voltage via a generator outlet and outputting a test voltage to be applied to a test sample; a low voltage compensation reactor connected between the intermediate frequency generator and the middle transformer; a high voltage compensation reactor connected between the middle transformer and the sample; wherein the electric motor and the intermediate frequency generator are arranged in a metal shell, and the system also includes the following filters: a filter arranged in the excitation circuit of the intermediate frequency generator, a filter arranged between the high voltage compensation reactor and the sample, and a filter arranged between the generator outlet and the low voltage compensation reactor.

Preferably, the partial discharge test power supply system further comprises a star-delta startup circuit coupled to electric motor, wherein a startup resistor is connected in series to the rotator.

Preferably, in the partial discharge test power supply system, the filter arranged in the excitation circuit of the intermediate frequency generator is a T type filter.

Preferably, in the partial discharge test power supply system, the filter arranged between the high voltage compensation reactor and the sample is a II type filter, which is arranged perpendicular to the high voltage compensation reactor at the outlet of the high voltage compensation reactor.

Preferably, the partial discharge test power supply system further comprises a control unit and protective unit arranged within the metal shell.

Preferably, the partial discharge test power supply system further comprises a remote control box arranged outside the metal housing and communicated with the control unit.

Preferably, the low voltage compensation reactor is a dry or oil immersed low voltage compensation reactor, which has an insulation voltage level matched with that of the intermediate frequency generator.

Preferably, the high voltage compensation reactor is an oil immersed cylinder high voltage compensation reactor, which has an insulation voltage level matched with the high voltage side of the middle transformer.

Preferably, the control unit receives a signal from a partial discharge tester through a feedback path, and automatically steps down and cuts off the power supply in abnormal events.

Preferably, the metal housing is a standard container.

According to a second aspect of this disclosure, a method of carrying out partial discharge test on an extra high voltage transform using a partial discharge test power supply system is provided, comprising: (i) rotating an electric motor to drive an intermediate frequency generator to output an intermediate frequency voltage, this step comprising: when startup, connecting stator windings in a star connection at the beginning of the startup while connecting the rotor to a startup resistor; after the electric motor is rotated, when a first predetermining period of time has been elapsed, switching the stator windings to a delta connection while keeping the rotor connected to the startup resistor, and with the increase in speed of the electric motor, when a second predetermined period of time has been elapsed, disconnecting the rotor from the startup resistor; and (ii) boosting the intermediate frequency voltage to an test voltage with the middle transformer to apply it to the extra high voltage transformer.

This disclosure may effectively suppress electromagnetic interference to outside produced by the test power supply system, and avoid impacts on partial discharge test. Furthermore, this disclosure may limit startup current of an electric motor to an allowed range, and thus is well suitable for partial discharge test of extra high voltage transformers.

BRIEF DESCRIPTION OP THE DRAWINGS

DETAILED DESCRIPTION

A preferred embodiment of this disclosure will be described in detail below with reference to accompanying drawings.

Figure 1:
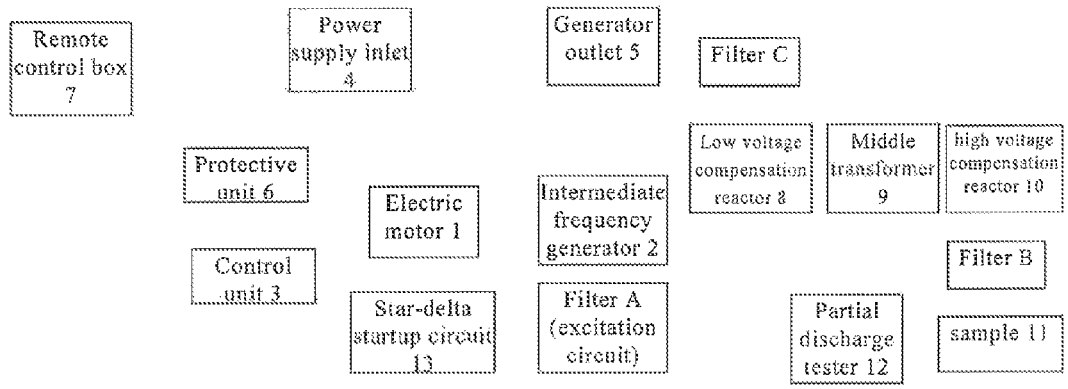
FIG. 1 is a schematic block diagram of a partial discharge test power supply system for extra high voltage transformers (EHVT) according to a preferred embodiment of this disclosure.

FIG. 1 shows a schematic block diagram of a partial discharge test power supply system for EHVT according to a preferred embodiment of this disclosure. As shown in FIG. 1, the system comprises a metal housing 100 (for example, a standard metal formed container). A power supply inlet 4 is provided on one side at the top of the metal housing 100 for introducing a 380V/50 Hz AC power source to power a control unit 3, a protective unit 6 and an electric motor 1, respectively. When the electric motor 1 is rotated, an intermediate frequency generator 2 is driven to output a voltage with an intermediate frequency. In operation, the capacities of the electric motor 1 and the intermediate frequency generator 2 are determined according to power capacities required in the partial discharge test of a sample 11 (i.e., an extra high voltage transformer to be tested). For example, assuming that the sample 11 is an single-phase auto-transformer having a capacity of 1000 MVA, it is required to select a 300 kW-1000 kW electric motor 1, and a 800 kWA-2500 kVA intermediate frequency generator 2, with normally 690-1000V output voltage and 100-200 Hz frequency for the generator 2.

The output current of the generator 2 is inputted to a middle transformer 9 via an electric motor outlet 5 (arranged on the other side at the top of the metal housing 100). The middle transformer 9 functions to boost the 690-1000V voltage outputted from the generator 2 to a voltage around 200 kV which is required by the test. The voltage output from the middle transformer 9 is ultimately applied to the sample (extra high voltage transformer) 11 for the partial discharge test.

Preferably, a low voltage compensation reactor 8 is connected in parallel between the intermediate frequency generator 2 and the middle transformer 9 for inductive component compensation. The low voltage compensation reactor 8 may be of dry or oil-immersed, which has an insulation voltage level of 690V~1000V matched with the intermediate frequency generator 2. Preferably, a high voltage compensation reactor 10 is connected in series or in parallel between the middle transformer 9 and the sample 11 for inductive component compensation. The high voltage compensation reactor 10 has an insulation voltage level matched with the high voltage side of the middle transformer 9, i.e., around 200 kV. The reactor 10 has an oil immersed cylinder structure, with good heat dissipation performance and allowing long period operation.

As described above, the 50 Hz power supply inlet 4 and the intermediate frequency (100-200 Hz) generator outlet 5 are arranged on opposite sides at the top of the metal housing 100. Furthermore, in the internal of the housing 100, the power supply inlet 4 and the generator outlet 5 are strictly isolated to prevent the occurrence of coupled interference.

There is also a control unit 3 and a protective unit 6 provided in the metal housing 100. In the control unit 3, there may be a PLC (programmable logic controller), a power acquisition module, a local/remote control converter, a voltage regulator, contactors, a middle relay and an exciter, etc to control the startup and stop of the electric motor 1, on and off of the exciting circuit of the intermediate frequency generator 2, the step-up or step-down of the intermediate frequency generator 2 and the like. A control panel including emergency operation buttons is arranged on the control unit 3.

There are circuit breakers provided in the protective unit 6, including a circuit breaker for the electric motor 1 and another circuit breaker for the intermediate frequency generator 2, capable of cutting off the test circuit in time when overvoltage, over-current or other faults occurs in the electric motor 1 and the intermediate frequency generator 2. This avoids harms to human bodies or devices.

As described above, this disclosure integrates the electric motor and intermediate frequency generator along with the control system into the metal housing 100, so as to shield electromagnetic interference of the power supply and the control system, reducing radiation to external environment and avoiding the impact of partial discharge test, in the case that the metal housing 100 is a standard container, the whole test power supply system can be moved and transported conveniently. Furthermore, this disclosure arranges all control and protective devices in two shielded units, namely, the control unit 3 and the protective unit 6 mounted on the bottom of the container, thus reducing sub-electromagnetic interference of the control and protective systems.

The partial discharge test power supply system further comprises a remote control box 7, which is disposed outside the metal housing 100 from the control unit 3. The remote control box 7 comprises control buttons to control the connection and disconnection of the exciter, the connection and disconnection of the generator outlet circuit breaker. The remote control box 7 further comprises a control button to control the voltage step-up and step-down of the whole test power supply system, an emergency stop button, input/output interfaces and input devices. The remote control box 7 is further provided with a LCD screen (not shown), which communicates with the PLC in the control unit 3 through an electric or optical cable or through wireless signals, so as to display in real time the operation states of the electric motor 1, the intermediate frequency generator 2 and the excitation circuit, the voltage and current of the electric motor 1, the voltage and current of the intermediate frequency generator 2, the active power outputted from the intermediate frequency generator 2, the phase angle between output voltage and current of the intermediate frequency generator 2 and other parameters. As to on-site tests, the remote control box 7 and the control unit 3 communicating with each other through optical fibers may bring out an advantage of electrical isolation between the remote control box 7 and the main system. Employing a low voltage electric cable to communicate has an advantage of high reliability. Wired connection to the main system can be ignored in wireless communication.

As described above, this disclosure provides local and remote controls in combination. A switch is provided in the control unit 3 to change the control manner. Through a local control panel arranged on the control unit 3, voltages and currents of the electric motor 1 and the intermediate frequency generator 2 and other working states can be monitored, and operations such as startup, excitation, voltage step-up/step-down, and emergency stop can be done. The system can be controlled and monitored remotely through the remote control box 7. The local control and the remote control are standby for each other, improving the reliability of the system.

In order to overcome a problem of too large startup current occurred when the capacity of the test power supply system is increased, in this disclosure, a star-delta startup circuit 13 is coupled to the electric motor 1, in which a startup resistor is connected in series to the rotor to limit the startup current into a allowed range.

Figure 2:
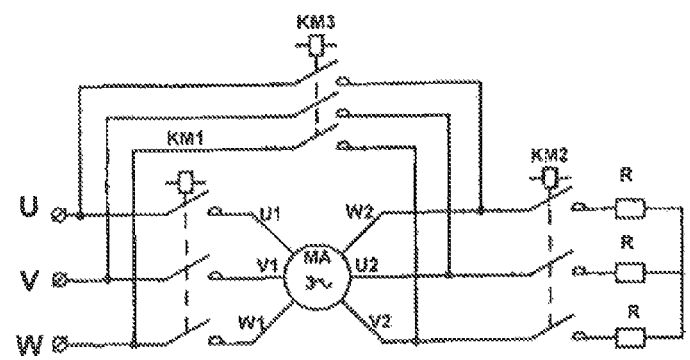
FIG. 2 is a schematic view of a star-delta startup circuit used in the preferred embodiment of this disclosure.

FIG. 2 shows a schematic view of the star-delta startup circuit 13, in which U, V, W represent a three-phase power supply, R is a rotor startup resistor (for example, ceramic resistor). Particularly, the electric motor is started up through the following process: when startup, contactors KM1, KM2 are closed to form a star connection of stator windings, while the rotor is connected to the startup resistor; after the electric motor is rotated for 30~50 s, when the motor reaches a speed of about 1100~1300 rpm, the star connection of the stator windings is switched to a delta connection through opening the contactor KM1 and closing the contactor KM3, while keeping the rotor connected to the startup resistor R; with the continuous increase in speed of the motor, after 5~15 s, KM2 is opened to remove the startup resistor R connected to the rotor, so that the electric motor enters a delta operation state to complete the startup of the motor. Through using such a star-delta startup manner, because motor startup current is in direct proportion to power supply voltage, the startup-current provided from the power grid is merely ⅓ of a full voltage startup-current of the motor. Through connecting a startup resistor to the rotor for motor startup, the startup voltage can be further divided by the resistor, which may lower the startup current together.

In order to further lower the interference level of the test power supply system, according to a preferred embodiment of this disclosure, the system deploys multiple filter circuits.

According to a preferred embodiment, the intermediate frequency generator 2 uses a column-type voltage regulator and thyristor for excitation through DC conversion, which may greatly simplify the device structure because no additional electric motor is required to drive exciting rotor(s). In order to eliminate high frequency interference generated in this manner, a filter A is provided in the excitation circuit of the intermediate frequency generator 2. Particularly, a T type filter circuit A is provided at the thyristor outlet to filter off interference and prevent it from entering test circuits.

A II type filer circuit B is provided between the high voltage compensation reactor 10 and the sample 11. Particularly, an inductor having appropriate inductance is connected in series to the circuit. Depending on the standard that interferences are of 20~200 kHz, an inductor is selected according to current requirement from a range of 100 μH~1000 μH for filtering, such that the occurrence of large voltage drop can be prevent while filtering effect is secured. Meanwhile, the filter device B is disposed perpendicular to the high voltage compensation reactor 10 at the outlet of the high voltage compensation reactor 10 to avoid the mutual induction and ensure the filtering effect.

A filter circuit C is provided between the generator outlet 5 and the low voltage compensation reactor 8 to filter off interferences coupled into test circuits from the GND or the air.

The filters A, B, C described above can be used separately or in combination. In the case of integration of such three filters, they collectively ensure that interference of the whole test power supply system can be controlled at a lower level during the test process, for example, less than 30 pC for 10000 kV transformers.

In a simple configuration, a partial discharge tester 12 connected to the sample 11 and the control unit 3 of the test power supply system are independent with each other. According to such a structure, in abnormal situations, human decisions are needed to send commands to increase/decrease the voltage of the test power supply system, which may be liable to cause a breakdown of the sample. According to a preferred embodiment, the partial discharge tester 12 is connected to the control unit 3 through a feedback path 101 to realize communication between the control unit 3 and the partial discharge tester 12. When a partial discharge power exceeding beyond a predetermined threshold is detected, the control unit 3 can auto-diagnose and alert, and can automatically decrease the voltage and cut off the power supply when it exceeds beyond the threshold by a certain factor to effectively prevent sample damage.

Figure 3:
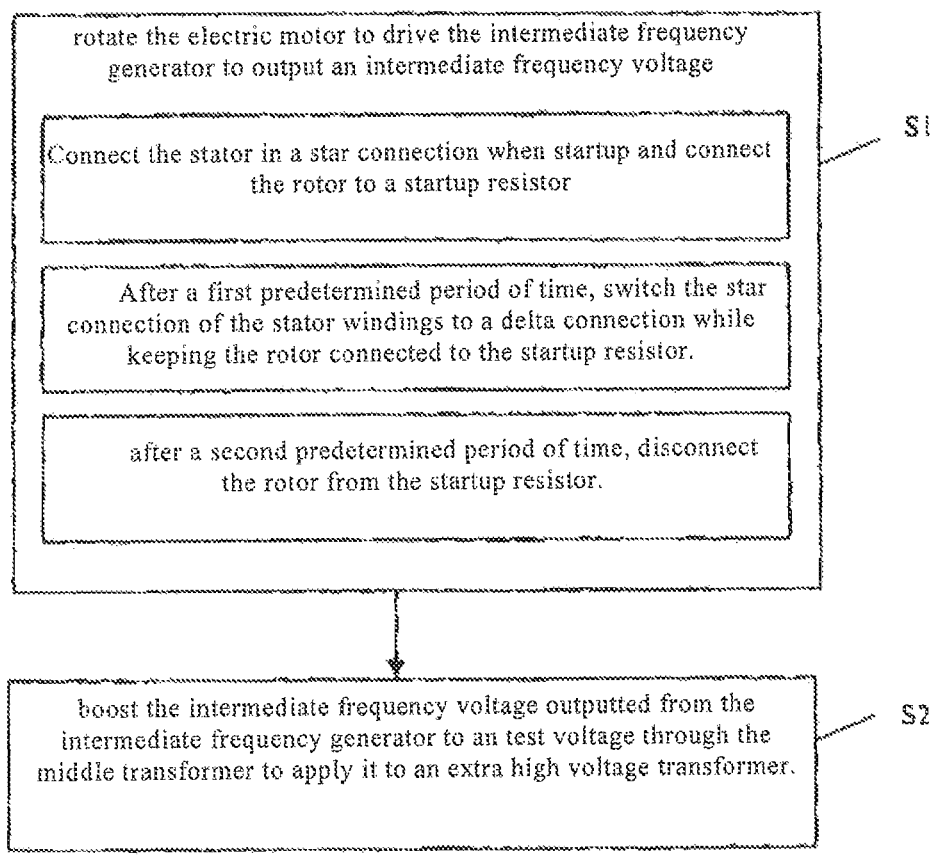
FIG. 3 is a flowchart of a method for carrying out partial discharge test on an EHVT with the partial discharge test power supply system according to the preferred embodiment of this disclosure.

Referring to FIG. 3, it shows a method of carrying out partial discharge test on an EHVT with the partial discharge test power supply system according to the preferred embodiment of this disclosure. In the power supply system, according to power capacity required in partial discharge test of the sample 11, an electric motor 1, an intermediate frequency generator 2, and a middle transformer 9 with appropriate capacities are provided, and a low voltage compensation reactor 8 and a high voltage compensation reactor 10 having matched insulation voltage levels are provided.

At step S1, the electric motor is rotated to drive the intermediate frequency generator 2 to output a voltage with intermediate frequency. The electric motor 1 is started up through the following process: when startup, stator windings are star-connected and the rotor is connected to a startup resistor at the beginning of the startup. After the electric motor is rotated for a first predetermined period of time (e.g., 30~50 s), when the motor-generator set reaches a speed of about 1100~1300 rpm, the star connection of the stator windings is switched to a delta connection through rapidly switching a double-throw switch, while keeping the rotor connected to the startup resistor. With the continuous increasing speed of the motor, after a second predetermined period of time has been elapsed (e.g., 5~15 s), the rotor is disconnected from the startup resistor.

At step S2, the voltage with intermediate frequency outputted from the intermediate frequency generator 2 is boosted to an test voltage through the middle transformer 9. The boosted voltage is applied to the EHVT acting as the sample 11.

During the test process, if the sample 11 is in an abnormal condition, the control unit 3 automatically decreases and cuts off the power supply in response to a signal received from the partial discharge tester 12 through the feedback path 101.

Through starting up the electric motor through star-delta startup in conjunction with connecting a startup resistor in series to the rotor, startup current can be lowered below a current threshold allowed by the transformer substation.

This disclosure has been described above in connection with the content of a preferred embodiment, however, those skilled in the art may recognize various variations and alternative embodiments, for example, through combining and/or changing features of an individual embodiment. Thus, it should be appreciated that all theses variations and alternative embodiments are conceived to be covered in this disclosure, and the scope of this disclosure is merely defined by the accompanying claims and its equivalents.

What is claimed is:

1. A partial discharge test power supply system for extra high voltage transformers (EHVT), comprising:
    an electric motor,
    an intermediate frequency generator driven by the electric motor and outputting an intermediate frequency voltage;
    a middle transformer receiving the intermediate frequency voltage via a generator outlet and outputting a test voltage to be applied to a test sample;
    a low voltage compensation reactor connected between the intermediate frequency generator and the middle transformer;

a high voltage compensation reactor connected between the middle transformer and the sample;

wherein the electric motor and the intermediate frequency generator are arranged in a metal housing, and the system further comprises the following filters:

(a) a filter arranged in the excitation circuit of the intermediate frequency generator, (b) a filter arranged between the high voltage compensation reactor and the sample, and (c) a filter arranged between the generator outlet and the low voltage compensation reactor.

2. The partial discharge test power supply system according to claim 1, further comprising a star-delta startup circuit coupled to the electric motor, wherein a startup resistor is connected in series to a rotator.

3. The partial discharge test power supply system according to claim 1, wherein the filter arranged in the excitation circuit of the intermediate frequency generator is a T type filter.

4. The partial discharge test power supply system according to claim 1, wherein the filter arranged between the high voltage compensation reactor and the sample is a Π type filter, which is arranged perpendicular to the high voltage compensation reactor at the outlet of the high voltage compensation reactor.

5. The partial discharge test power supply system according to claim 1, further comprising a control unit and a protective unit arranged within the metal housing.

6. The partial discharge test power supply system according to claim 1, further comprising a remote control box arranged outside the metal housing and in communication with the control unit.

7. The partial discharge test power supply system according to claim 1, wherein the low voltage compensation reactor is a low voltage compensation reactor of dry or oil immersed type, which has an insulation voltage level matched with the intermediate frequency generator.

8. The partial discharge test power supply system according to claim 1, wherein the high voltage compensation reactor is an oil immersed cylinder high voltage compensation reactor, which has an insulation voltage level matched with the high voltage side of the middle transformer.

9. The partial discharge test power supply system according to claim 1, wherein the control unit receives a signal from a partial discharge tester through a feedback path, and the control unit automatically decreases and cuts off the power supply in abnormal events.

10. The partial discharge test power supply system according to claim 1, wherein the metal housing is a standard container.

11. A method of carrying out partial discharge test on an extra high voltage transform (EHVT) using the partial discharge test power supply system of claim 2, comprising steps of:

(i) rotating an electric motor to drive an intermediate frequency generator to output an intermediate frequency voltage, this step comprising:

when startup, connecting stator windings in a star connection at the beginning of the startup while connecting the rotor to a startup resistor, after the electric motor is rotated, when a first predetermining period of time has been elapsed, switching the stator to a delta connection while keeping the rotor connected to the startup resistor, and with the increasing speed of the electric motor, when a second predetermined period of time has been elapsed, disconnecting the rotor from the startup resistor; and (ii) boosting the intermediate frequency voltage to a test voltage by the middle transformer to apply the boosted voltage to the EHVT.

12. The method according to claim 11, further comprising:

in abnormal conditions of the EHVT, the control unit automatically decreases and cuts off the power supply in response to a signal received from a partial discharge tester through a feedback path.

* * * * *